United States Patent
Nakaune et al.

(10) Patent No.: US 6,960,533 B2
(45) Date of Patent: Nov. 1, 2005

(54) METHOD OF PROCESSING A SAMPLE SURFACE HAVING A MASKING MATERIAL AND AN ANTI-REFLECTIVE FILM USING A PLASMA

(75) Inventors: Koichi Nakaune, Kudamatsu (JP); Masatoshi Oyama, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 321 days.

(21) Appl. No.: 10/314,283

(22) Filed: Dec. 9, 2002

(65) Prior Publication Data

US 2003/0080091 A1    May 1, 2003

Related U.S. Application Data

(62) Division of application No. 09/791,553, filed on Feb. 26, 2001, now abandoned.

(30) Foreign Application Priority Data

Feb. 25, 2000 (JP) .............................. 2000-054459

(51) Int. Cl.$^7$ ........................................... H01L 21/302
(52) U.S. Cl. ...................... 438/710; 438/711; 438/712; 438/717; 438/725
(58) Field of Search ....................... 438/710, 711, 712, 438/717, 725

(56) References Cited

U.S. PATENT DOCUMENTS

6,207,583 B1 * 3/2001 Dunne et al. ................ 438/725
6,479,401 B1 * 11/2002 Linliu et al. ................ 438/763

FOREIGN PATENT DOCUMENTS

| JP | 05-251406 | 9/1993 |
| JP | 10-261618 | 9/1998 |
| JP | 10-268526 | 10/1998 |
| JP | 10-303183 | 11/1998 |

* cited by examiner

Primary Examiner—Nadine Norton
Assistant Examiner—Binh X. Tran
(74) Attorney, Agent, or Firm—Antonelli, Terry, Stout and Kraus, LLP.

(57) ABSTRACT

A surface processing apparatus is provided. In the apparatus, an etching rate ratio of an organic material such as a BARC of anti-reflective film to a resist of mask forming a pattern, that is, a selective ratio is high, the anti-reflective film being a means for forming the pattern with a high accuracy in surface processing of a semiconductor. In the surface processing apparatus, which uses a plasma, a deposition gas is added to a light element of hydrogen as the etching gas. Ions accelerated by a bias electric power supply accelerate etching reaction. Sputtering at edges of the mask can be reduced by using the light element of hydrogen as the etching gas, and the selective ratio of the anti-reflective film to the masking material can be increased by mixing the deposition gas with the hydrogen.

5 Claims, 3 Drawing Sheets

(a) INITIAL SHAPE (b) CONVENTIONAL TECHNOLOGY (HALOGEN+O₂)

(c) H₂

(d) H₂+CHF₃

METHOD OF PROCESSING A SAMPLE SURFACE HAVING A MASKING MATERIAL AND AN ANTI-REFLECTIVE FILM USING A PLASMA

This application is a Divisional application of application Ser. No. 09/791,553, filed Feb. 26, 2001, now abandoned, the contents of which are incorporated herein by reference in their entirety.

BACKGROUND OF THE INVENTION

The present invention relates to a surface processing apparatus and a surface processing method for a sample such as a semiconductor element and, more particularly to a surface processing apparatus and a surface processing method suitable for performing etching and film forming on a semiconductor surface using a plasma.

Apparatuses widely used for processing such as etching and film forming of a semiconductor element are apparatuses using a plasma. The present invention can be applied to such apparatuses using a plasma, but here, a conventional technology will be explained in taking an apparatus called as an ECR (electron cyclotron resonance) type among them as an example. In the apparatus of this type, the plasma is generated by a microwave in a vacuum chamber applied with a magnetic field from the external. A bias voltage is applied to a sample in order to accelerate ions incident to the sample. The apparatus is used for film deposition as well as etching.

Recent semiconductor elements are required to be processed with high accuracy as the structure of semiconductor elements becomes finer. Therefore, a new technology is also required to improve the dimensional accuracy of a masking pattern in order to process the etched material highly accurately. As a method of controlling dimensions in forming a pattern of the masking material, a technology using an anti-reflective film such as BARC (bottom anti-reflective coating) is used in order to prevent reflection of light such as ultraviolet light and to expose finely and accurately. In general, the anti-reflective film is a film made of a material which is the same organic group as a material used for the resist, and the anti-reflective film is etched by a fluorocarbon group gas or a halogen group gas mixed with oxygen, and the selective ratio of the anti-reflective film material to the masking material at processing the anti-reflective film is nearly 1. Further, edge portions of the masking pattern are apt to be cut down by sputtering at the etching, which is a trouble at processing the base etched material. (Refer to FIG. 3(b))

SUMMARY OF THE INVENTION

In order to solve the above-mentioned new problem, an object of the present invention is to provide a surface processing apparatus and a surface processing method in which the selective ratio, that is, a ratio of etching rate of the organic group film such as the BARC to the film made of the same group material such as the resist is increased, and the surface processing is performed while an initial shape of the resist is changed as small as possible.

The present invention is characterized by an apparatus of processing a sample surface comprising a vacuum chamber; a means for generating a plasma in the vacuum chamber; a sample table for mounting a sample to be performed with surface processing using the plasma; and an electric power supply for applying a radio frequency bias to the sample, the surface processing of the sample being performed using a masking material and an anti-reflective film, which further comprises a means for introducing a mixed gas of hydrogen gas and a deposition gas as an etching gas into the vacuum chamber.

Further, the present invention is characterized by a method of processing a sample surface which performs surface processing of a sample by using a plasma by generating the plasma in a vacuum chamber; applying a radio frequency bias to a sample table mounting the sample; using a masking material and an anti-reflective film, the method comprising the step of introducing a mixed gas of hydrogen gas and a deposition gas as an etching gas into said vacuum chamber.

Further, the present invention is characterized by that an amount of the deposition gas added to the hydrogen gas is set to an amount E0 at which a cut-down amount of the masking material becomes zero.

According to the present invention, the anti-reflective film can be highly accurately etched by using a light element of hydrogen as the etching gas to reduce the cut-down amount of edges of the masking material of resist caused by sputtering and at the same time by mixing the deposition gas with the hydrogen gas to increase the selective ratio of the anti-reflective film to the masking material of resist.

DESCRIPTION OF THE PREFERRED EMBODIMENTS

Embodiments of the present invention will be described below.

Figure 1:
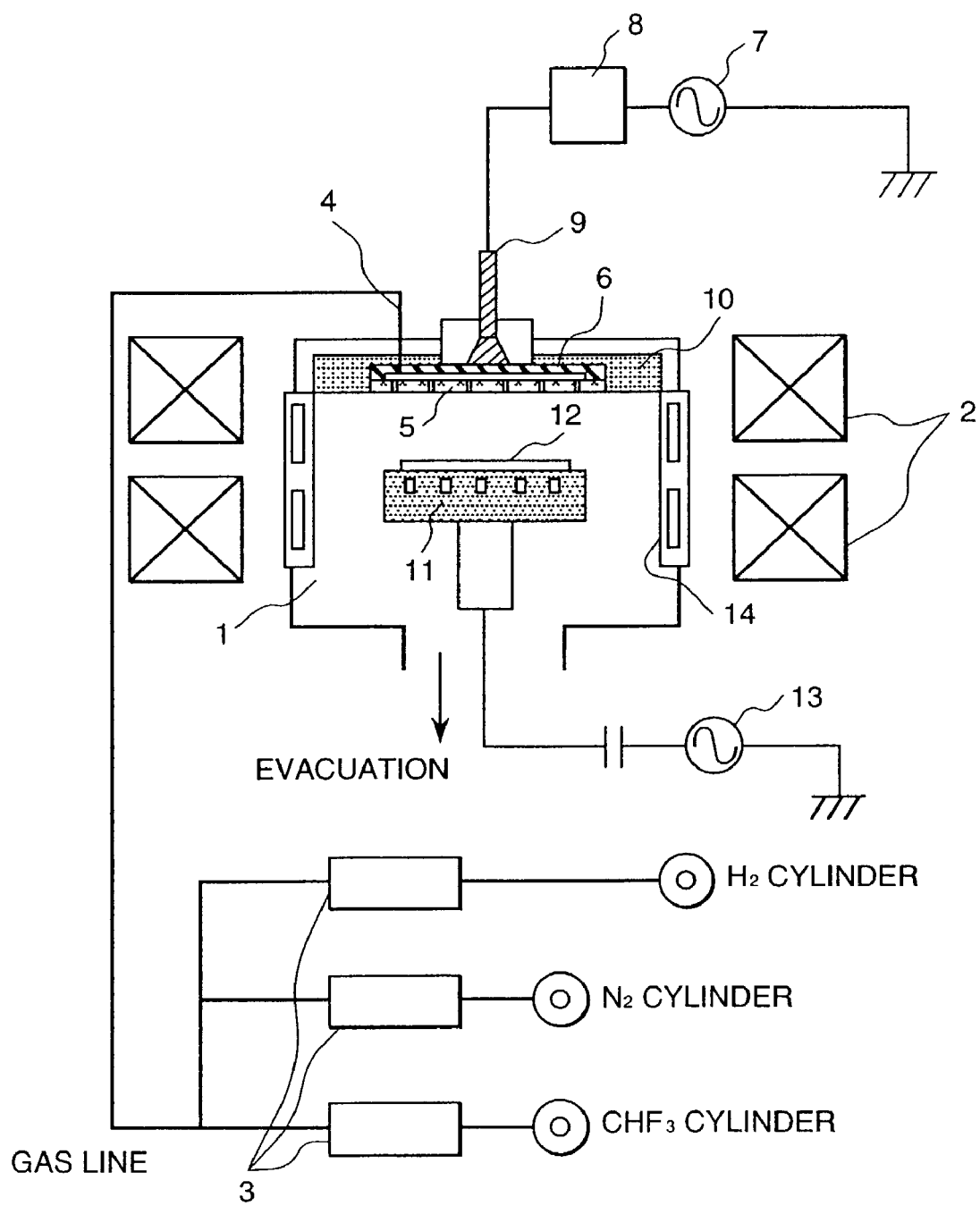
FIG. 1 is a diagram showing the overall construction of an etching apparatus to which the present invention is applied.

FIG. 1 is a schematic diagram showing a plasma etching apparatus to which the present invention is applied. The apparatus is a plasma etching apparatus utilizing electron cyclotron resonance. A coil 2 for generating a magnetic field for the electron cyclotron resonance (ECR) is arranged around an etching chamber 1 of vacuum chamber. An etching gas is supplied through a gas supply pipe 4 which is connected to a gas source through a mass flow controller 3, and introduced into the etching chamber 1 from a gas supply plate 5 made of silicone or glass form carbon having several hundreds fine holes having a diameter of 0.4 to 0.5 mm.

A disk-shaped antenna 6 for radiating a microwave of the UHF band is arranged above the gas supply plate 5, and the microwave to the antenna 6 is transmitted from an electric power supply 7 through a matching circuit 8 and a guide tube 9. The microwave is radiated from the periphery of the antenna 6, and a resonance electric field in a space above the antenna 6 is introduced into the etching chamber through a dielectric body 10. The frequency of the microwave is selected a value from a band which can heat the plasma up to a low electron temperature of 0.25 eV to 1 eV, that is, it is within a range of 300 MHz to 1 GHz. In the present embodiment, a frequency band near 450 MHz was used. Quartz or alumina may be used for the dielectric body 10.

Otherwise, a heat-resistant polymer having a small dielectric loss such as polyimide may be used.

A wafer mounting electrode 11 is arranged below the gas supply plate 5, and a wafer 12 is supported on the wafer mounting electrode by electrostatic attraction (an electric power supply for the electrostatic attraction is not shown). In order to draw the ions in the plasma into the wafer 12, a radio frequency bias is applied to the wafer mounting electrode 11 from a radio frequency electric power supply 13.

Temperature of the antenna 6 and an inner wall 14 of the etching chamber are controlled. That is, the temperature is controlled by introducing a coolant into the antenna 6 and the inner wall 14 of the etching chamber from a temperature controller, not shown, to maintain the antenna 6 and the inner wall 14 at a constant temperature. In the present embodiment, the temperature is controlled so that the antenna 6 and the inner wall 14 was maintained at a temperature of 30 to 80° C.

A turbo molecular pump having an evacuating speed of 2000 to 3000 L/s is arranged in a vacuum chamber directly connected to the etching chamber 1. A conductance valve, not shown, for controlling the evacuation speed is arranged at an opening portion of the turbo molecular pump to adjust the evacuation speed in order to attain a flow rate and a pressure suitable for the etching. Further, a stop valve is provided in order to isolate the turbo molecular pump at opening the etching chamber to atmosphere.

An embodiment of BARC etching using the plasma etching apparatus in accordance with the present invention will be described below.

A wafer is loaded from a transfer chamber into the etching chamber 1 under a condition evacuated to a high vacuum using a transfer arm, not shown, and transferred onto the wafer mounting electrode 11. After the transfer arm is drawn back and a valve between the etching chamber 1 and the transfer chamber is closed, the wafer mounting electrode 11 is moved upward and stopped at a position suitable for etching. In the case of the present embodiment, the distance between the wafer 12 and the gas introducing plate 5 (distance between the electrodes) was set to 50 mm to 100 mm.

A mixed gas of $H_2$ and $N_2$ was used as the etching gas, and $H_2$ and $N_2$ were introduce at the flow rates of 100 sccm and 5 sccm, respectively. $CHF_3$ was added to the mixed gas as a deposition gas. The output power of the UHF microwave electric power supply was set to 1.5 kW, and the output power of the bias electric power supply 12 to the wafer was set 60 W. A resonance magnetic field of 0.016 T of UHF microwave 450 MHz was generated between the gas supply plate 5 and the wafer mounting electrode 11 (that is, the wafer 12). Then, the microwave electric power supply 7 was operated. Thereby, a strong plasma was generated in the ECR region of the magnetic field intensity of 0.016 T by the electron cyclotron resonance.

It is necessary that the incident ion density on the surface of the wafer 12 is made uniform in order to make the etching property uniform. An optimal ion density distribution can be obtained because the ECR position can be freely adjusted using the magnetic field coil 2. In the present embodiment, the shape of the ECR region was formed in a convex state to the wafer 12 side.

After the plasma is ignited, a high voltage is applied to the wafer electrode 11 from a direct current electric power supply, not shown, connected to the radio frequency electric power supply 13 in parallel to electrostatically attract the wafer 12 onto the wafer mounting electrode 11. Helium gas is introduced to the backside surface of the elecrostatically attracted wafer 12, and temperature control of the wafer is performed between the wafer mounting surface of the wafer mounting electrode 11 temperature-controlled by a coolant and the wafer through the helium gas.

Next, the radio frequency electric power supply 13 is operated to apply the radio frequency bias to the wafer mounting electrode 11. By doing so, ions are vertically incident to the wafer 12 from the plasma. When the bias voltage is applied to the wafer 12, etching is initiated. The etching is terminated in a preset etching time. Otherwise, the change in a light emission intensity of the plasma caused by a reaction product is monitored, and an etching termination time is obtained by judging the etching termination, and then the etching is terminated after performing appropriate over-etching. The termination of etching is the time when the application of the radio frequency bias voltage is stopped. At the same time, the supply of the etching gas is also stopped.

Next, a process to detach the electrostatically attached wafer 12 from the wafer mounting electrode 10 is necessary, and in this process argon or a kind of gas actually used in the etching is used as a discharging gas. After stopping the supply of the electrostatic attracting voltage and the power supply line is grounded, the discharging is performed for approximately 10 seconds while the microwave is being discharged. By doing so, the charge on the wafer 12 is removed to the ground through the plasma, and consequently the wafer 12 can be easily detached. After completion of the discharging process, the supply of the discharging gas is stopped and the supply of the microwave is also stopped. Further, the current supply to the coil 2 is also stopped. The level of the wafer mounting electrode 11 is lowered down to the wafer transfer position.

After that, the etching chamber 1 is evacuated to a high vacuum for a while. At the time when the high vacuum evacuation is completed, the valve between the transfer chamber and the etching chamber is opened and the transfer arm is inserted to receive and unload the wafer 12. When there is a next wafer to be etched, the new wafer is loaded and the etching is performed according to the above-mentioned procedure.

The above is a typical flow of the etching process.

Figure 2:
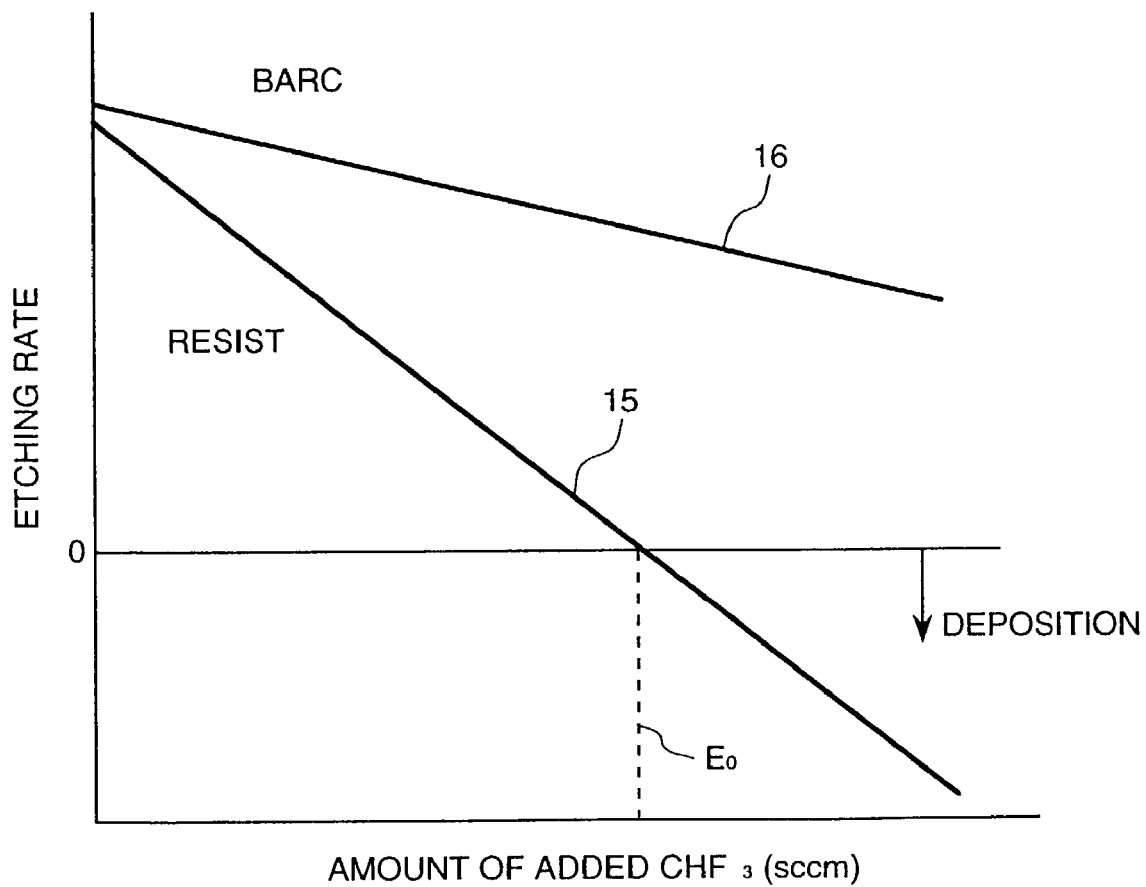
FIG. 2 is a graph showing the relationship between the etching rates of a BARC and a resist depending on the added amount of a deposition gas.
Figure 3:
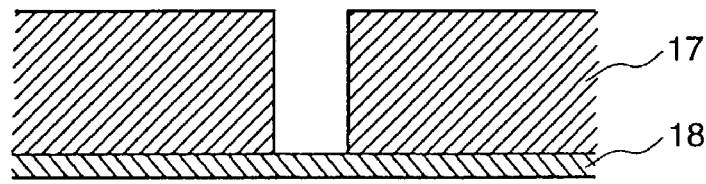
FIG. 3 is a view showing differences in etched shapes depending on presence or absence of an etching gas and a deposition gas.
Figure 3:
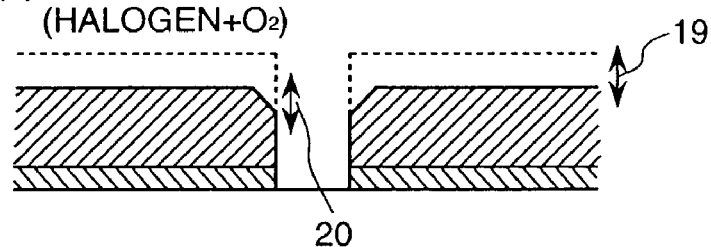
Figure 3:
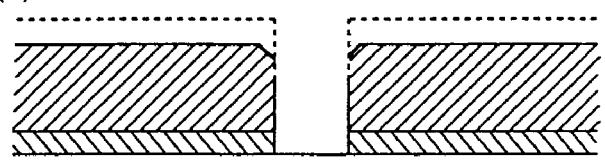
Figure 3:
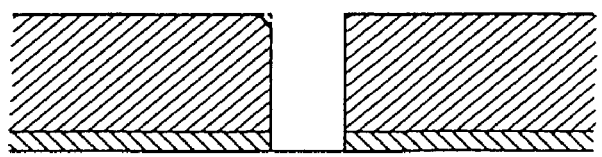

An effect of adding a deposition gas will be briefly described below. FIG. 2 is a graph showing the relationship between the added amount of $CHF_3$ of one of deposition gases and the etching rates of a BARC and a resist depending on, and FIG. 3 is a view showing etched shapes.

It can be understood from FIG. 2 that as the amount of the additive gas is increased, the etching rate of the resist 15 is largely decreased, that is, cut down not so much though the etching rate of the BARC 16 is decreased not so much. However, when the amount of the additive gas exceeds a a value, the resist 15 is accumulated to the contrary. Therefore, at an added amount E0 of the gas in which the cut-down amount of the resist becomes zero, etching having the selective ratio of infinity can be performed. It is practical that the amount of additive gas is set to a value around the amount E0 and within a range in which a selective ratio of the anti-reflective film to the masking material is larger than 2.

FIG. 3(a) a view showing an initial shape of a sample to be etched. FIG. 3(b) a comparative view showing an etched shape which is etched through a conventional technology, that is, using a mixed gas of halogen and $O_2$ as the additive gas. In the conventional technology, edge cutting-down appears at an opening portion of the resist.

On the other hand, in an embodiment of the present invention, that is, in a case where hydrogen is used as the main etching gas and no additive gas is not mixed, an etched shape becomes as shown in FIG. 3(c). Edge cutting-down at an opening portion is reduced compared to that in the conventional technology because a light element of hydrogen is used as the main etching gas. Further, by mixing an additive gas to hydrogen ($H_2$+$CHF_3$), etching with edge cutting-down of the resist can be performed.

In regard to the adding amount of $CHF_3$ in the present embodiment, the flow rate of $CHF_3$ was varied from 0 sccm to 2 sccm and 8 sccm against the flow rates of $H_2$ of 100 sccm and $N_2$ of 5 sccm. The cut-down amounts of the resist of masking material after etching the BARC having a film thickness of 80 nm under the above conditions were 120 nm to the initial film thickness of 720 nm when the added amount of $CHF_3$ was zero, and 0 nm when the added amount of $CHF_3$ was 2 sccm. On the contrary, when the added amount of $CHF_3$ was 8 sccm, the sedimentation was 83 nm. Therefore, by etching the BARC under the condition of the added amount of $CHF_3$ E0=2 sccm, etching of the selective ratio to the masking material of infinity can be performed. Further, because the light element of hydrogen is used as the main gas of the etching gas, the cut-down amount of edges of the opening portion of the resist caused by sputtering is very small.

The reason why the resist is not cut down but only the etching reaction of the BARC made of the same kind material is progressed is considered that by introducing $CHF_3$ as the deposition gas, a CH group sediment having a strong deposition property is accumulated only on the resist surface so much as to inhibit the etching reaction. Although the present embodiment has been described on the premise that $CHF_3$ is used as the deposition gas, the deposition gas is not limited to $CHF_3$, and any gas capable of producing a CH group sediment which reacts with hydrogen and has a high adhesive coefficient may be used.

Although the present embodiment has been described on the premise that the UHF type ECR plasma etching apparatus is used, the apparatus is not limited to the UHF type ECR plasma etching apparatus, and the other plasma source may be used. Therefore, the present invention can be applied to an induction type plasma apparatus other than the microwave type.

Further, although the temperature control in the embodiment is performed using a coolant, it is not limited to the coolant, and water cooling, forced cooling by gas, or use of a heater, lamp heating using infrared rays may be used.

As described above, in the present invention, the selective ratio of the BARC (the anti-reflective film) to the resist of mask made of the same group material can be increased, and at the same time the BARC can be etched with maintaining the initial shape of the resist by the effect of using the etching gas mainly composed of the light element of hydrogen and adding the deposition gas.

As having been described above, according to the present invention, an organic material such as the material of BARC can be etched with a high selective ratio to the same find of materials used for the resist or the like and with maintaining the initial shape of the resist. That is, the sputtering property in the edge portions of the mask is reduced by using the light element of hydrogen as the etching gas, and the selective ratio of the BARC material to the masking material can be increased by mixing the deposition gas with the etching gas. By the synergistic effect, an anti-reflective film can be etched with a high selective ratio while an initial shape of the resist is changed as small as possible.

What is claimed is:

1. A method of processing a sample surface having a masking material and an anti-reflective film, said method performing surface processing of the sample surface using a plasma, comprising generating the plasma in a vacuum chamber; and applying a radio frequency bias to a sample table mounting the sample, wherein:

said masking material and said anti-reflective film are made of a same organic group material, and said method of processing includes processing the same organic group material by steps of:

introducing a mixed gas of (a) hydrogen gas and (b) any deposition gas, as an etching gas, into said vacuum chamber for said generating said plasma, wherein an amount of said deposition gas in said mixed gas, with said hydrogen gas, is set to a value, said value being an amount Eo at which a cut-down amount of said masking material becomes zero, and surface processing said sample surface, made of the same organic group material, by using said plasma.

2. A method of processing a sample surface according to claim 1, wherein said deposition gas contains one gas selected from the group consisting of $CHF_3$, $CH_2F_2$ and $CF_4$.

3. A method of processing a sample surface according to claim 1, wherein said deposition gas mixed with said hydrogen gas is a gas containing carbon as a constituent element.

4. A method of processing a sample surface according to claim 1, wherein said deposition gas is a gas that increase the selectivity ratio of etching said anti-reflective film to etching said masking material, as compared to the selectivity ratio of etching said anti-reflective film to etching said masking material by a gas containing hydrogen and no deposition gas.

5. A method of processing a sample surface according to claim 1, wherein said deposition gas is any capable of producing a CH group sediment which reacts with hydrogen and adheres to said masking material.

* * * * *